United States Patent [19]
Lin

[11] Patent Number: 5,769,628
[45] Date of Patent: Jun. 23, 1998

[54] FURNACE EXHAUST SYSTEM WITH REGULATOR

[75] Inventor: Lien-Fang Lin, Chia-I Hsien, Taiwan

[73] Assignee: Vanguard International Semiconductor Corporation, Hsinchu, Taiwan

[21] Appl. No.: 642,488

[22] Filed: May 3, 1996

[51] Int. Cl.[6] .................................................. F27D 17/00
[52] U.S. Cl. .......................... 432/241; 137/171; 432/67
[58] Field of Search ................................. 432/5, 6, 152, 432/241, 67; 96/136; 137/171; 138/44

[56] References Cited

U.S. PATENT DOCUMENTS

| | | | |
|---|---|---|---|
| 4,033,269 | 7/1977 | Little et al. | 137/13 |
| 4,906,182 | 3/1990 | Moller | 432/152 |
| 5,250,092 | 10/1993 | Nakano | 96/136 |
| 5,407,349 | 4/1995 | Hansotte, Jr. et al. | 432/241 |

*Primary Examiner*—Henry A. Bennett
*Assistant Examiner*—Gregory A. Wilson
*Attorney, Agent, or Firm*—Christensen O'Connor Johnson & Kindness PLLC

[57] ABSTRACT

A furnace exhaust system with a regulator is disclosed. The furnace exhaust system comprises a furnace for providing a reaction chamber wherein a semiconductor process takes place, exhaust gas reacted from the semiconductor process being released through an exhaust pipe. An air pressure controller is connected to the furnace through the pipe for maintaining the pressure of the exhaust gas in the furnace and the pipe, the air pressure controller comprising a sensor for monitoring the pressure of the exhaust gas in the pipe, and a valve for controlling the passage of the exhaust gas according to the sensor. A regulator is connected to the pipe for providing an air block and an air buffer, the regulator comprising at least one cup-shaped structure with at least one hole in the bottom of the cup-shaped structure, the hole allowing condensed liquid from the furnace to be drained out.

7 Claims, 5 Drawing Sheets

FURNACE EXHAUST SYSTEM WITH REGULATOR

FIELD OF THE INVENTION

The present invention relates to an exhaust system, and more particularly, to a furnace exhaust system with a regulator.

BACKGROUND OF THE INVENTION

It is well recognized that the ability of a silicon surface to form a silicon dioxide ($SiO_2$) layer is one of the most significant processes in semiconductor industry. For example, a silicon dioxide layer is frequently used to protect the semiconductor devices from physical contamination. Furthermore, a silicon dioxide layer also serves as a doping barrier for both diffusion and ion implant processes. Acting as an insulator, a silicon dioxide layer can be used to prevent shorting of a metal layer to another device. Finally, in metal oxide semiconductor (MOS) technology, a silicon dioxide layer often is used as a dielectric material in the gate region.

Two major methods are known for growing the silicon dioxide layer on silicon. The first method is referred to as dry oxidation in which oxygen is used as an oxidant. It is a relatively simple reaction as shown below:

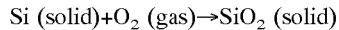

Si (solid)+$O_2$ (gas)→$SiO_2$ (solid)

The second method, referred to as wet oxidation, uses water vapor ($H_2O$) instead of oxygen as the oxidant by the reaction as follows:

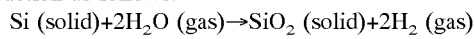

Si (solid)+$2H_2O$ (gas)→$SiO_2$ (solid)+$2H_2$ (gas)

Depending on the layer thickness required, the oxidant $H_2O$ is supplied by bubbling a carrier gas through a glass of deionized water at elevated temperature. Alternatively, the oxidant is generated directly from reacting oxygen and hydrogen.

In either method, the pressure inside the furnace where oxidation takes place must be maintained at a preset value, otherwise a flat silicon dioxide layer at specified thickness cannot be achieved. Further, any by-products or unreacted gas should be expelled from the furnace so as not to affect the pressure inside the furnace. FIG. 1 shows a conventional furnace exhaust system for automatically monitoring the pressure in a furnace 10 and for exhausting gas out of furnace 10. By-products or unreacted gas is led through a pipe 12 to an exhaust assembly 14. An air pressure controller (APC) 16, which is located midway between the furnace 10 and the exhaust assembly 14, is used to maintain the air pressure inside the pipe 12 and the furnace 10.

The air pressure controller (APC) 16 includes a butterfly-shaped valve 160, and a sensor 162 for monitoring the pressure inside the pipe 12. The control mechanism of the valve 160 is controlled according to the signal collected from the sensor 162. For example, for a preset value of −10 $mmH_2O$ pressure, the valve 160 will close slightly when the pressure monitored by the sensor 162 reaches −15 $mmH_2O$. On the contrary, when the pressure approaches −5 $mmH_2O$, the valve 160 will open slightly in order to release more air out of the exhaust assembly 14.

Another main element of the apparatus that is important for maintaining the air pressure in the furnace 10 is a water gathering cup mechanism 18 located between the furnace 10 and a drain assembly 20. During the wet oxidation process, unreacted vapor ($H_2O$) condenses into liquid water as shown in FIG. 2A.

Inside the water gathering cup mechanism 18 is a cup 180 for collecting condensed water 182. When the cup 180 fills, gas 184 cannot flow down to drain assembly 20 because the liquid 182 in the cup 180 forms a barrier against the flow of gas 184.

Unfortunately, in dry oxidation mode as shown in FIG. 2B, this cup mechanism 18 does not work well. This is because there is no liquid in the cup mechanism 18 to prevent the gas 186 from escaping through the drain 20. Consequently, the lack of a backpressure from the cup mechanism 18 causes an almost direct connection between the exhaust assembly 14 and the drain assembly 20, making the control of furnace pressure by APC 16 very difficult.

SUMMARY OF THE INVENTION

A semiconductor furnace system is disclosed. The furnace system comprises a reaction chamber for holding a semiconductor process, said semiconductor process generating a liquid or gas by-product, an exhaust pipe for carrying said by-products, said exhaust pipe diverging into a gas pipe for carrying said gas by-products and a liquid pipe for carrying said liquid by-products, an air pressure controller connected to the reaction chamber via the exhaust pipe and the gas pipe, said air pressure controller for maintaining the pressure of the exhaust gas in the reaction chamber and the exhaust pipe, said air pressure controller including (i) a sensor for monitoring the pressure of the by-products in the exhaust pipe, and (ii) a valve for controlling the passage of the by-products according to the sensor, and a regulator placed inside the liquid pipe, said regulator comprising at least one cup-shaped structure with at least one hole in the bottom of the cup-shaped structure, said hole allowing condensed liquid from the furnace to be drained out.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
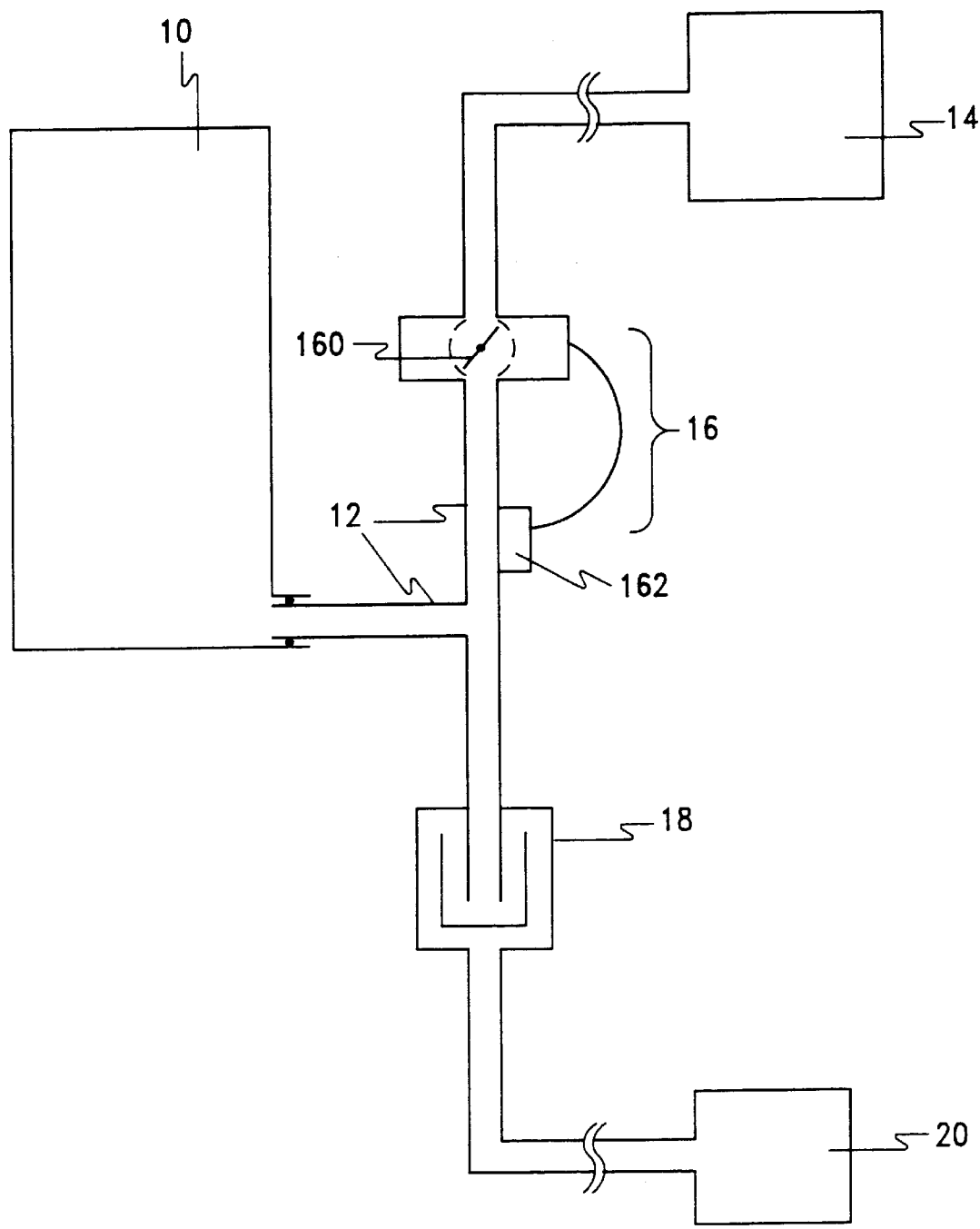
FIG. 1 shows a conventional furnace exhaust system.
Figure 2B:
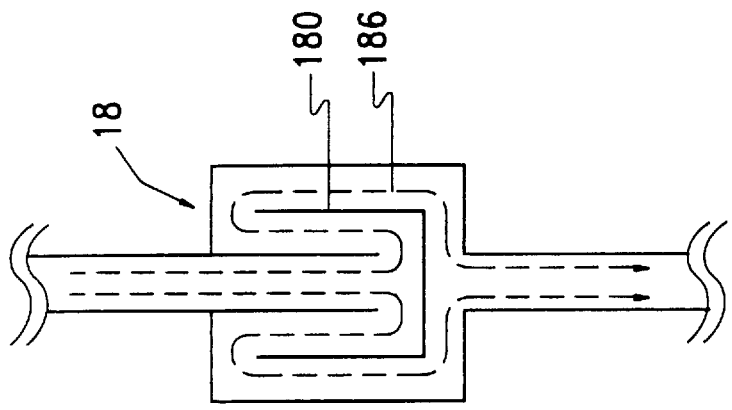
FIG. 2B shows the water gathering cup of a conventional furnace exhaust system in the dry oxidation mode.
Figure 2A:
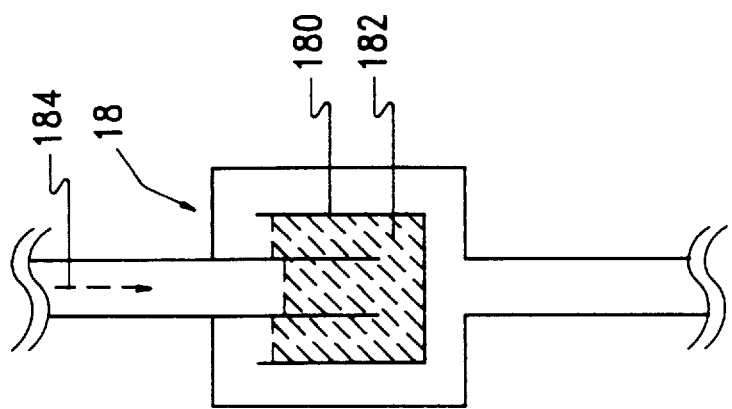
FIG. 2A shows the water gathering cup of a conventional furnace exhaust system in the wet oxidation mode.
Figure 3A:
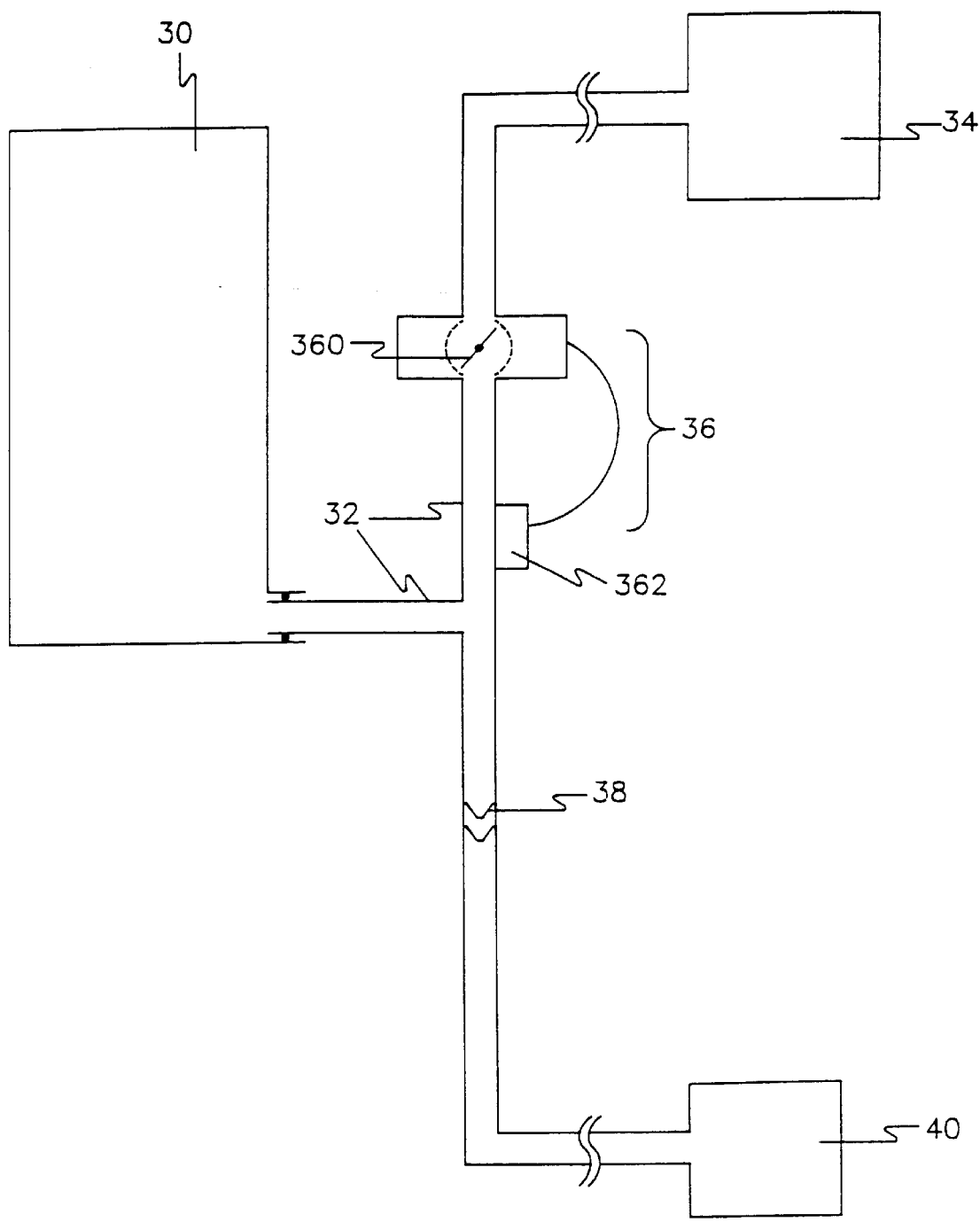
FIG. 3A shows one embodiment of the present invention.

FIG. 3A shows one embodiment of the present invention for automatically maintaining air pressure in a furnace 30. Exhaust gas is led through a pipe 32 to an exhaust assembly 34 for release. Between exhaust assembly 34 and furnace 30 is an air pressure controller (APC) 36 for maintaining the air pressure inside the pipe 32 and the furnace 30.

This air pressure controller (APC) 36 includes a butterfly-shaped valve 360 and a sensor 362. The sensor 362 continuously monitors the pressure inside the pipe 32, and the valve 360 controls the passage of the exhaust gas according to the monitored date signal collected from the sensor 362. In particular, the valve 360 will close slightly when the pressure is below a preset value for the nominal furnace pressure. On the other hand, if the pressure is above the preset value, the valve 360 will open slightly to let more gas out of the exhaust system.

Figure 3B:
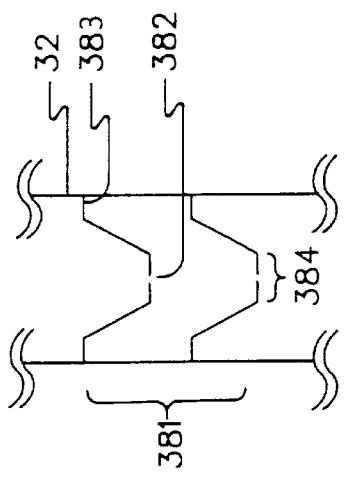
FIG. 3B shows the side view of the regulator in the present invention.

The main feature of the present invention is a regulator 38 located between the furnace 30 and a drain assembly 40. A magnified side view of this regulator is shown in FIG. 3B and a top view shown in FIG. 3C. The regulator 32 includes two cups 381 mounted in series inside the pipe 32. In one actual embodiment, the pipe 32 has a diameter of 2.5 centimeters.

The cups 381 include a horizontal securing ring (381), an inner bottom surface 384, and a hole (381). The horizontal securing ring (381) is fixedly attached to the inner wall of pipe 32 and in orthogonal relationship thereto. In addition, the cups 381 are attached to pipe 32 such that the inner bottom surface 384 faces the flow of furnace by-products or exhaust gas. Inner bottom surface 384 is circular in shape and centered with and concentric to horizontal securing ring (381). In addition, inner bottom surface 384 is planarly parallel to horizontal securing ring (381). Thus, the side walls of cups (382) form a truncated cone. Hole 381 is preferably formed in the center of inner bottom surface 384.

The two cups 381 are identical and are preferably spaced 5~8 centimeters apart. In addition, each cup is preferably 1.5 centimeters in depth, i.e., the separation between horizontal securing ring (381) and inner bottom surface 384 is approximately 1.5 centimeters. The cups are preferably formed from polyvinyl chloride (PVC) material. The inner radius of horizontal ring (381) is preferably 2 centimeters. The radius of inner bottom surface 384 is preferably 1 centimeter. The dimension of hole 382 is preferably between 1–3 millimeters. The hole (382) allows condensed liquid to be drained out to the drain assembly 40 during a wet oxidation.

Figure 3C:
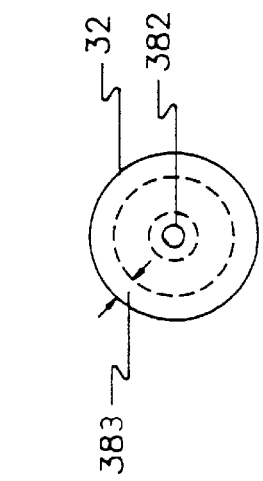
FIG. 3C shows the top view of the regulator in the present invention.

Although two cup-shaped structures are shown in FIG. 3C, it can be appreciated that any number of cup-shaped structures can be used instead without departing from the spirit of the present invention.

Figure 4A:
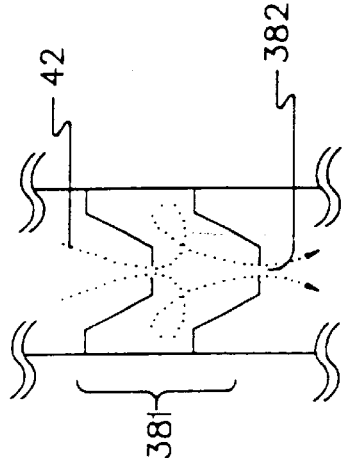
FIG. 4A shows the mechanism of the exhaust gas flowing through a dual-cup regulator.
Figure 4B:
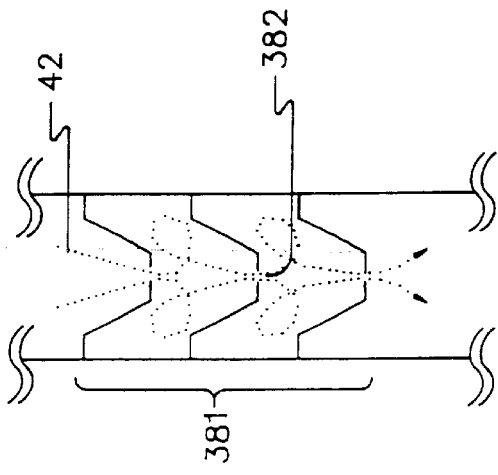
FIG. 4B shows the mechanism of the exhaust gas flowing through a tri-cup regulator.

FIG. 4A and FIG. 4B show how the exhaust gas 42 flows through the regulator 38 during a dry oxidation with dual-cup and tri-cup structure respectively. As seen in the FIGURES, hole (382) is sufficiently small so as to prevent a significant amount of gas to flow through to the drain assembly 40. This makes the regulator 38 serve as both a good air seal and an air buffer.

For example, TABLE 1 below shows experimental data of the air pressure (in $mmH_2O$) in a furnace taken every five seconds without using the regulator 38. For a preset pressure value of $-10$ $mmHO_2$, the pressure fluctuates between 1~20 $mmH_2O$. In contrast, after a regulator 38 formed in accordance with the present invention is installed, the variations in pressure are significantly reduced. The data are collected is shown in TABLE 2.

TABLE 1

| Time | 5 | 10 | 15 | 20 | 25 | 30 | 35 | 40 |
|---|---|---|---|---|---|---|---|---|
| Pressure | −12 | −1 | −17.2 | −3.0 | −20 | −17 | −6.1 | −4.2 |
| Time | 45 | 50 | 55 | 60 | 65 | 70 | 75 | 80 |
| Pressure | −19.5 | −5.5 | −4 | −15 | −20 | −4 | −6 | −11 |
| Time | 85 | 90 | 95 | 100 | 105 | 110 | 120 | 125 |
| Pressure | −5 | −14 | −6 | −20 | −10 | −7 | −8 | −1.6 |

TABLE 1-continued

| Time | 5 | 10 | 15 | 20 | 25 | 30 | 35 | 40 |
|---|---|---|---|---|---|---|---|---|
| Pressure | −9.2 | −8.9 | −9.2 | −9.2 | −9.2 | −8.4 | −8.0 | −8.2 |
| Time | 45 | 50 | 55 | 60 | 65 | 70 | 75 | 80 |
| Pressure | −9.0 | −9.4 | −8.8 | −9.6 | −9.2 | −9.2 | −8.1 | −8.3 |
| Time | 85 | 90 | 95 | 100 | 105 | 110 | 120 | 125 |
| Pressure | −9.2 | −9.2 | −8.4 | −8.8 | −9.1 | −9.0 | −9.1 | −9.2 |

Figure 5:
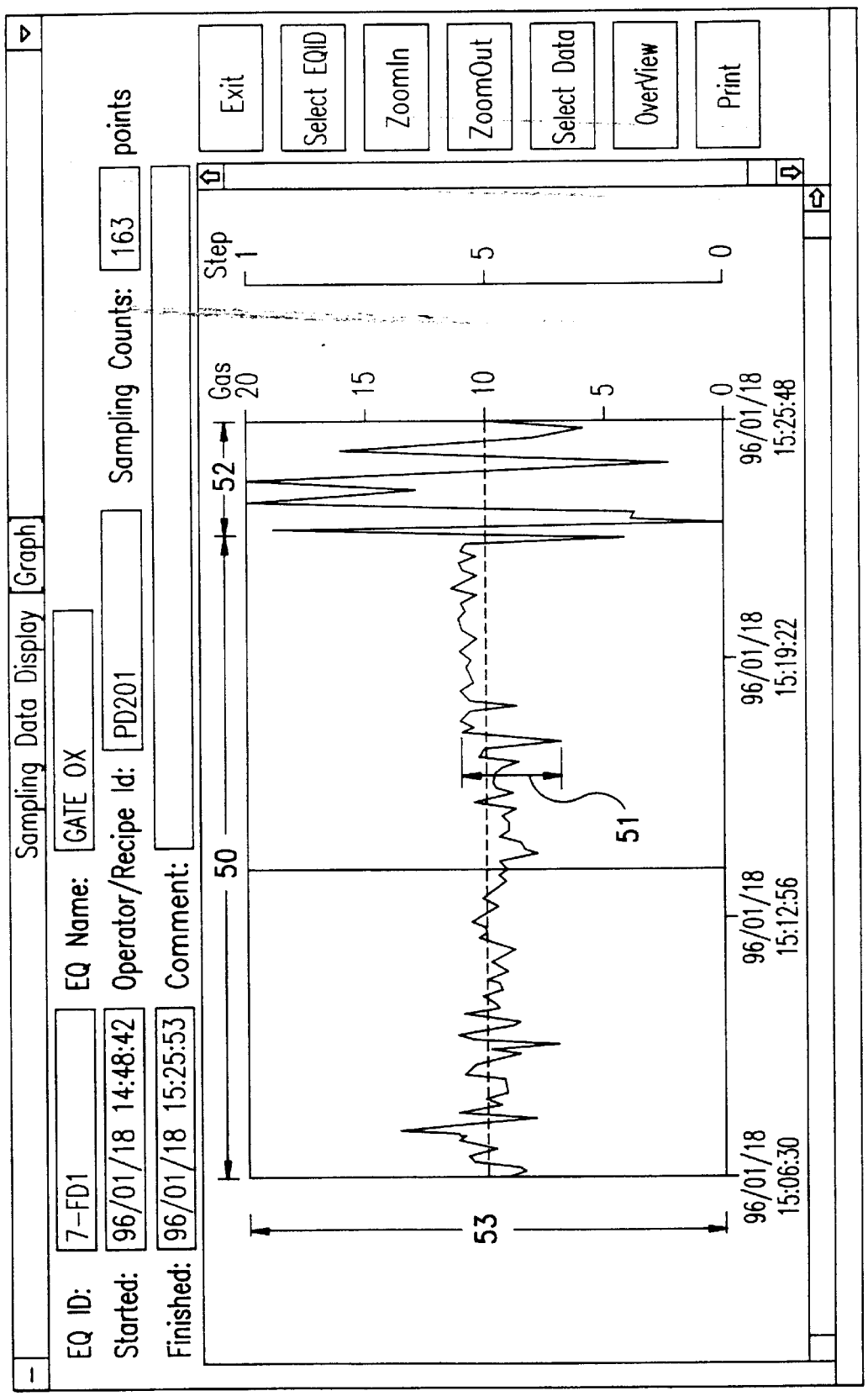
FIG. 5 is a graph illustrating the efficacy of the present invention in controlling furnace pressure.

FIG. 5 shows graphically experimental data of furnace pressure as gathered in a second experiment. During the time period 5O, the regulator 38 is used to maintain the pressure, and while during time period 52, no regulator is installed. Comparing the maximum peak-to-peak fluctuation 51 of the interval 50 to the fluctuation 53 of the interval 52, the pressure controllability of the furnace exhaust system with a regulator 38 improves more than five times than a conventional exhaust systenm Although the furnace exhaust system is described in conjunction with wet and dry oxidation, it is understood that other processes, such as diffusion, can also be taken place in the furnace. Moreover, plastic, metal or other material can be used in making the regulator mentioned above.

Although specific embodiment has been illustrated and described, it will be obvious to those skilled in the art that various modifications may be made without departing from the spirit which is intended to be limited solely by the appended claims.

The embodiments of the invention in which an exclusive property or privilege is claimed are defined as follows:

1. A semiconductor furnace system comprising:
    a reaction chamber for holding a semiconductor process, said semiconductor process generating a liquid or gas by-product;
    an exhaust pipe for carrying said by-products, said exhaust pipe diverging into a gas pipe for carrying said gas by-products and a liquid pipe for carrying said liquid by-products;
    an air pressure controller connected to the reaction chamber via the exhaust pipe and the gas pipe, said air pressure controller for maintaining the pressure of the exhaust gas in the reaction chamber and the exhaust pipe, said air pressure controller including
        (i) a sensor for monitoring the pressure of the by-products in the exhaust pipe, and
        (ii) a valve for controlling the passage of the by-products according to the sensor; and
    a regulator placed inside the liquid pipe, said regulator comprising at least one cup-shaped structure with at least one hole in the bottom of the cup-shaped structure, said hole allowing condensed liquid from the furnace to be drained out.

2. The system of claim 1 further comprising exhaust means connecting to the gas pipe of the air pressure controller for releasing the exhaust gas.

3. The system of claim 1 further comprising drain means connecting to the liquid pipe for draining condensed liquid from said hole.

4. The system of claim 1 wherein the inner diameter of said exhaust pipe is about 2.5 centimeters.

5. The system of claim 1 wherein the diameter of said hole is about 1~3 millimeters.

6. The system of claim 1 wherein said regulator comprises two said cup-shaped structures.

7. The system of claim I wherein said regulator comprises three said cup-shaped structures.

* * * * *